US008751885B2

United States Patent
You

(10) Patent No.: US 8,751,885 B2
(45) Date of Patent: Jun. 10, 2014

(54) REPAIR CONTROL CIRCUIT AND SEMICONDUCTOR INTEGRATED CIRCUIT USING THE SAME

(75) Inventor: Jung Taek You, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 101 days.

(21) Appl. No.: 13/602,244

(22) Filed: Sep. 3, 2012

(65) Prior Publication Data
US 2013/0326268 A1    Dec. 5, 2013

(30) Foreign Application Priority Data

May 30, 2012   (KR) .................. 10-2012-0057328

(51) Int. Cl.
*G01R 31/28* (2006.01)
(52) U.S. Cl.
USPC ........................................ 714/733; 714/718
(58) Field of Classification Search
USPC ........ 365/185.09, 189.09, 200; 714/710, 724, 714/733, 718
See application file for complete search history.

(56) References Cited

U.S. PATENT DOCUMENTS

| 7,405,973 | B2 * | 7/2008 | Park ..................... 365/185.09 |
| 7,764,553 | B2 * | 7/2010 | Riho ..................... 365/189.09 |
| 7,978,548 | B2 * | 7/2011 | Cho ........................... 365/200 |
| 8,023,347 | B2 * | 9/2011 | Chu et al. ................... 365/200 |
| 8,427,872 | B2 * | 4/2013 | Kim ..................... 365/185.09 |

* cited by examiner

*Primary Examiner* — David Ton
(74) *Attorney, Agent, or Firm* — William Park & Associates Patent Ltd.

(57) ABSTRACT

A repair control circuit and a semiconductor integrated circuit using the same, which can reduce test time, are provided. The semiconductor integrated circuit includes a plurality of memory blocks in which a plurality of word lines are arranged, a plurality of word line drivers driving one or more of the plurality of word lines in response to a plurality of memory block selection signals, and a repair control circuit determining whether to perform a repair through comparison of repair addresses generated in response to surplus addresses and the plurality of memory block selection signals with external addresses.

19 Claims, 7 Drawing Sheets

REPAIR CONTROL CIRCUIT AND SEMICONDUCTOR INTEGRATED CIRCUIT USING THE SAME

CROSS-REFERENCES TO RELATED APPLICATION

The present application claims priority under 35 U.S.C. §119(a) to Korean application number 10-2012-0057328, filed on May 30, 2012, in the Korean Intellectual Property Office, which is incorporated herein by reference in its entirety as set forth in full.

BACKGROUND

1. Technical Field

The present invention relates to a semiconductor circuit, and more particularly, to a repair control circuit and a semiconductor integrated circuit using the same.

2. Related Art

A semiconductor integrated circuit 1 in the related art includes, as illustrated in FIG. 1, a plurality of unit memory blocks (hereinafter referred to as "MAT"), each of which is provided with a plurality of memory cells, a plurality of bit line sense amplifiers BLSA, a word line driver 10, and a repair control circuit 20.

The repair control circuit 20 includes, as illustrated in FIG. 2, a repair address generation unit 21, a comparison unit 22, and a repair unit 23.

The repair address generation unit 21 generates repair column addresses CRADDR<0:n> in response to a plurality of MAT selection signals MATSEL<0:n> and a bank active signal ActiveBK.

The comparison unit 22 activates a repair signal REP if the column addresses CADDR<0:n> and the repair column addresses CRADDR<0:n> coincide with each other.

The repair unit 23 activates a repair column selection signal RYi<c> if the repair signal REP is activated.

As a method to reduce time for testing in the related art, a plurality of word lines are simultaneously activated to reduce column access time tRCD after a read command and precharge time tRTP after a column access.

Referring to FIG. 1, a method for simultaneously activating a plurality of word lines WL<a> and WL<b> has been used to reduce time for testing.

However, this method is unable to be used after cells in which defects have occurred are repaired, and the reason is as follows.

If the plurality of word lines LW<a> and WL<b> are activated after the repair is performed, corresponding MAT selection signals MATSEL<0:n> are generated.

It is then required that a repair column selection signal RYi that corresponds to one repair column address CRADDR<0:n> is generated according to one MAT selection signal MATSEL<i>.

However, since the plurality of MAT selection signals, for example, two MAT selection signals MATSEL<i, j>, are simultaneously generated, the column selection signals Yi<a, b> that correspond to different column addresses are simultaneously activated, and this causes a column repair error to occur.

A wrong repair column selection signal RYi is activated instead of a normal column selection signal, and data which is different from the data that is required in a test operation is output that may cause a fatal problem.

Accordingly, the test method in the related art through simultaneous enabling of a plurality of word lines is unable to be used after the repair, and thus is not possible to reduce test time.

SUMMARY

An embodiment of the present invention relates to a repair control circuit and a semiconductor integrated circuit using the same, which can reduce test time.

In an embodiment of the present invention, a repair control circuit includes: a selection signal generation unit configured to generate selection signals in response to surplus addresses, a selection unit configured to selectively output a plurality of memory block selection signals for selecting one or more of a plurality of memory blocks connected to word lines in response to the selection signals, and a repair address generation unit configured to generate repair addresses in response to the selection signals and outputs of the selection unit.

In an embodiment of the present invention, a semiconductor integrated circuit includes: a plurality of memory blocks in which a plurality of word lines are arranged, a plurality of word line drivers driving one or more of the plurality of word lines in response to a plurality of memory block selection signals, and a repair control circuit determining whether to perform a repair through comparison of repair addresses generated in response to surplus addresses and the plurality of memory block selection signals with external addresses.

According to the embodiments of the present invention, it is possible to perform a test in which a plurality of word lines are simultaneously activated even after the repair of cells in which defects have occurred is performed, and thus is possible to reduce test time.

BRIEF DESCRIPTION OF THE DRAWINGS

Features, aspects, and embodiments are described in conjunction with the attached drawings, in which.

DETAILED DESCRIPTION

Hereinafter, the present invention will be described in detail with reference to the accompanying drawings through various embodiments.

Figure 1:
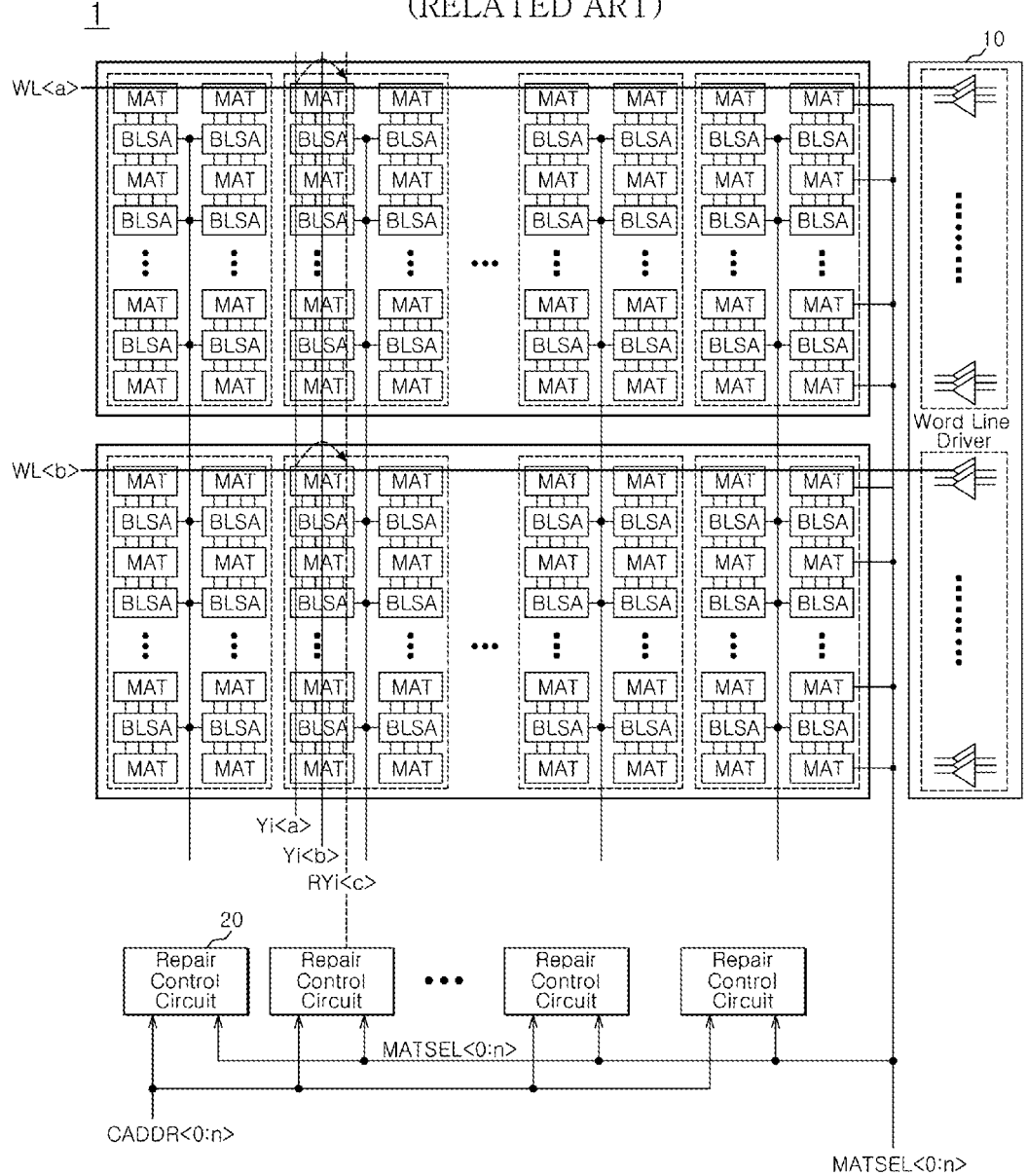
FIG. 1 is a block diagram illustrating the configuration of a semiconductor integrated circuit in the related art.
Figure 2:
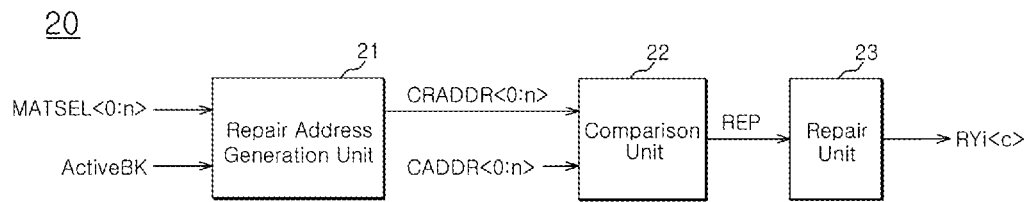
FIG. 2 is a block diagram illustrating the internal configuration of a repair control circuit in FIG. 1.
Figure 3:
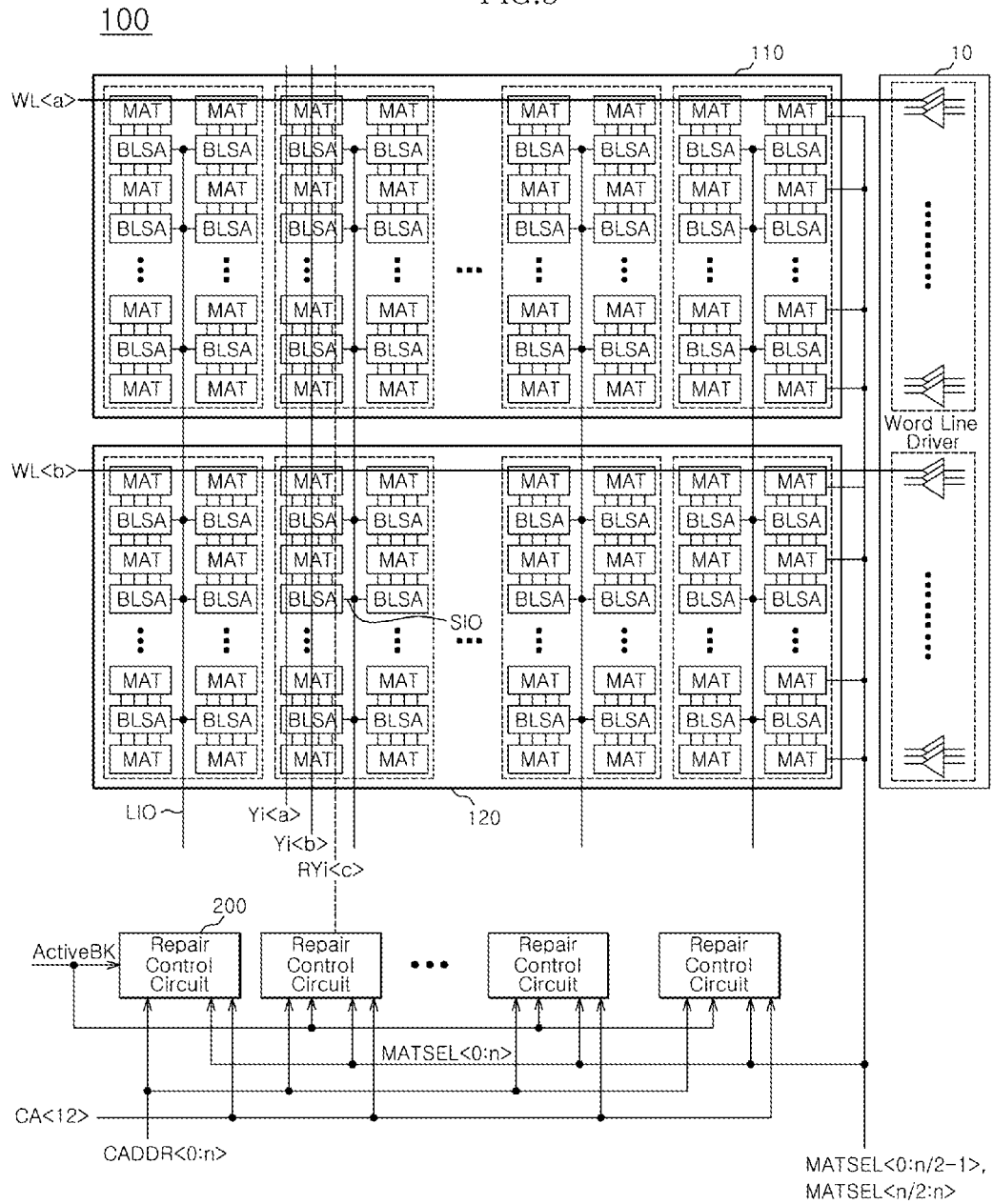
FIG. 3 is a block diagram illustrating the configuration of a semiconductor integrated circuit according to an embodiment of the present invention.

FIG. 3 is a block diagram illustrating the configuration of a semiconductor integrated circuit 100 according to an embodiment of the present invention.

As shown in FIG. 3, the semiconductor integrated circuit 100 according to an embodiment of the present invention includes a plurality of unit memory blocks (hereinafter referred to as "MAT"), each of which is provided with a plurality of memory cells, a plurality of bit line sense amplifiers BLSA, a plurality of word line drivers 10, and a plurality of repair control circuits 200.

The plurality of unit memory blocks may be divided into a first block 110 and a second block 120.

The semiconductor integrated circuit 100 according to an embodiment of the present invention makes it possible to perform a test using a method in which a plurality of word lines WL<a> and WL<b> are simultaneously activated even after the repair of cells in which defects have occurred is performed.

Figure 4:
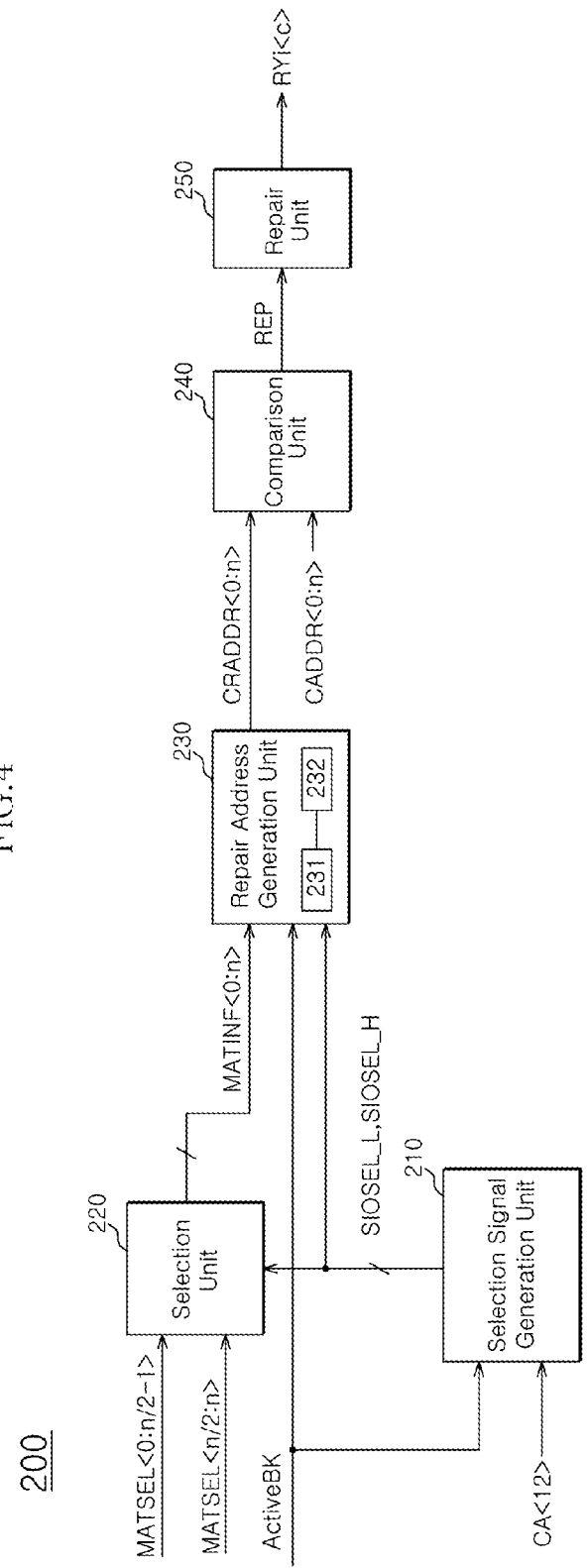
FIG. 4 is a block diagram illustrating the internal configuration of a repair control circuit in FIG. 3.

FIG. 4 is a block diagram illustrating the internal configuration of a repair control circuit 200 in FIG. 3.

As illustrated in FIG. 4, a repair control circuit 200 includes a selection signal generation unit 210, a repair address generation unit 230, a comparison unit 240, and a repair unit 250.

The selection signal generation unit 210 is configured to generate selection signals SIOSEL_L and SIOSEL_H in response to a bank active signal ActiveBK and a column address, such as a surplus column address, CA<12>.

The selection unit 220 is configured to select one of a plurality of memory block selection signals (hereinafter referred to as "a plurality of MAT selection signals") MATSEL<0:n/2-1> and MATSEL<n/2:n> in response to the selection signals SIOSEL_L and SIOSEL_H, and to output the selected signal as a final MAT selection signal MATINF<0:n>.

The MAT of the first block 110 may be selected according to MATSEL<0:n/2-1>, and the MAT of the second block 120 may be selected according to MATSEL<n/2:n>.

The repair address generation unit 230 is configured to generate repair column addresses CRADDR<0:n> in response to the final MAT selection signal MATINF<0:n>, the bank active signal ActiveBK, and the selection signals SIOSEL_L and SIOSEL_H.

The repair address generation unit 230 may be divided into first and second blocks 231 and 232.

The comparison unit 240 is configured to activate a repair signal REP if the repair column addresses CRADDR<0:n> coincide with column addresses CADDR<0:n>.

The repair unit 250 is configured to activate a repair column selection signal RYi<c> if the repair signal REP is activated.

Figure 5:
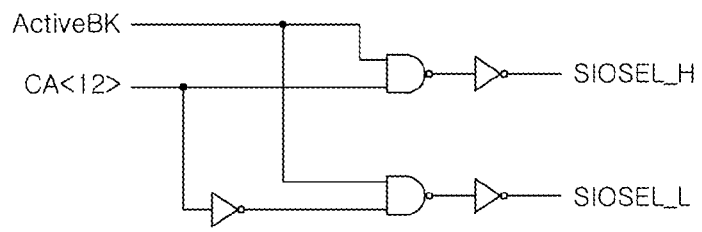
FIG. 5 is a circuit diagram illustrating the internal configuration of a selection signal generation unit in FIG. 4.

FIG. 5 is a circuit diagram illustrating the internal configuration of a selection signal generation unit 210 in FIG. 4.

As illustrated in FIG. 5, the selection signal generation unit 210 includes a plurality of inverters and a plurality of NAND gates.

The selection signal generation unit 210 performs logical products of the bank active signal ActiveBK and the surplus column address CA<12> to generate the selection signal SIOSEL_H, and performs logical products of the bank active signal ActiveBK and an inverted surplus column address CA<12> to generate the selection signal SIOSEL_L.

Figure 6:
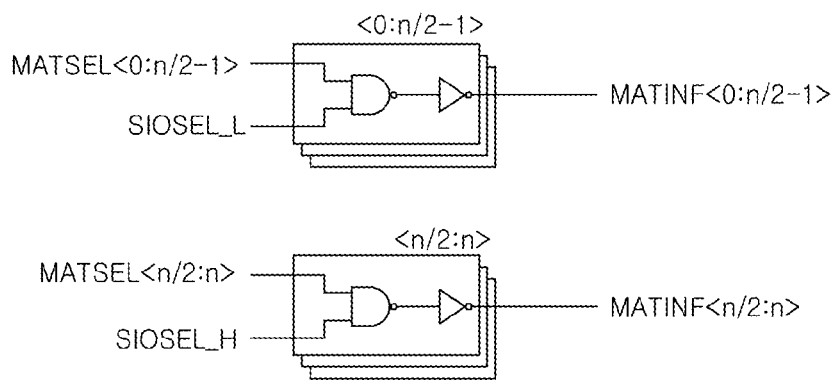
FIG. 6 is a circuit diagram illustrating the internal configuration of a selection unit in FIG. 4.

FIG. 6 is a circuit diagram illustrating the internal configuration of a selection unit 220 in FIG. 4.

As illustrated in FIG. 6, the selection unit 220 includes a plurality of NAND gates and a plurality of inverters.

The selection unit 220 performs logical products of the selection signal SIOSEL_L and the plurality of MAT selection signal MATSEL<0:n/2-1> to output the final MAT selection signal MATINF<0:n/2-1>, and performs logical products of the selection signal SIOSEL_H and the plurality of MAT selection signal MATSEL<n/2:n> to output the final MAT selection signal MATINF<n/2:n>.

Figure 7:
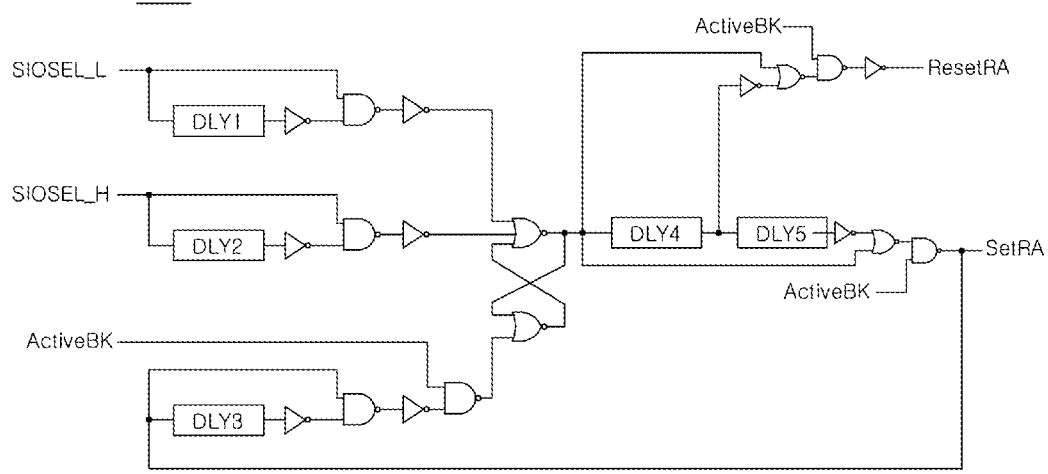
FIG. 7 is a circuit diagram illustrating the internal configuration of a repair address generation unit in FIG. 4.

FIG. 7 is a circuit diagram illustrating the internal configuration of a repair address generation unit 231 in FIG. 4.

As illustrated in FIG. 7, the first block 231 of the repair address generation unit 230 includes a plurality of NOR gates, a plurality of NAND gates, a plurality of inverters, and a plurality of delay elements DLY1 to DLY5.

The first block 231 generates repair address control signals ResetRA and SetRA using pulse signals generated with a predetermined time difference in response to the selection signals SIOSEL_L and SIOSEL_H and the bank active signal ActiveBK.

The shift of the repair address control signals ResetRA and SetRA is determined by the selection signals SIOSEL_L and SIOSEL_H and the bank active signal ActiveBK.

The shift timing of the repair address control signals ResetRA and SetRA is determined by delay elements DLY1 to DLY3.

The pulse widths of the repair address control signals ResetRA and SetRA are determined by delay elements DLY4 and DLY5.

Figure 8:
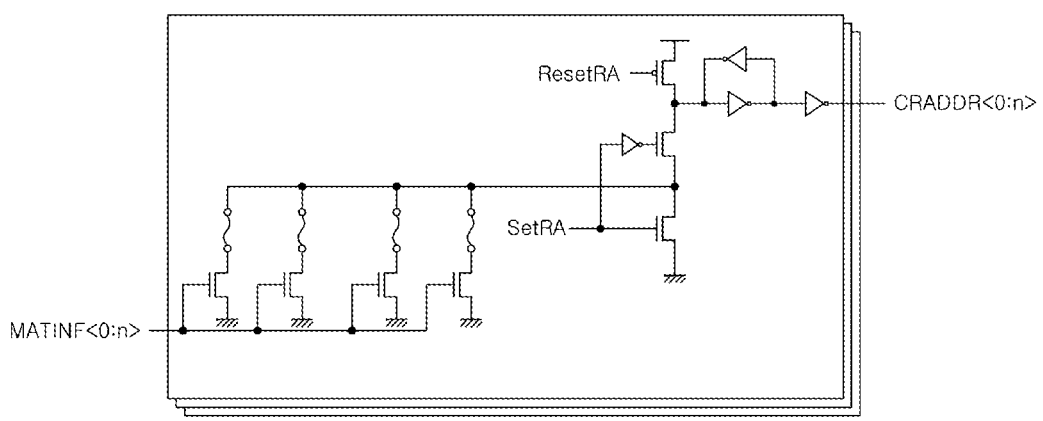
FIG. 8 is a circuit diagram illustrating the internal configuration of a repair address generation unit in FIG. 4.

FIG. 8 is a circuit diagram illustrating the internal configuration of a repair address generation unit 232 in FIG. 4.

As illustrated in FIG. 8, the second block 232 of the repair address generation unit 230 includes a plurality of inverters, a plurality of transistors, and a plurality of fuses.

The second block 232 generates repair column addresses CRADDR<0:n> depending on whether the fuse corresponding to the final MAT selection signal MATINF<0:n> has been cut during a low-level period of the repair address control signal ResetRA.

Figure 9:
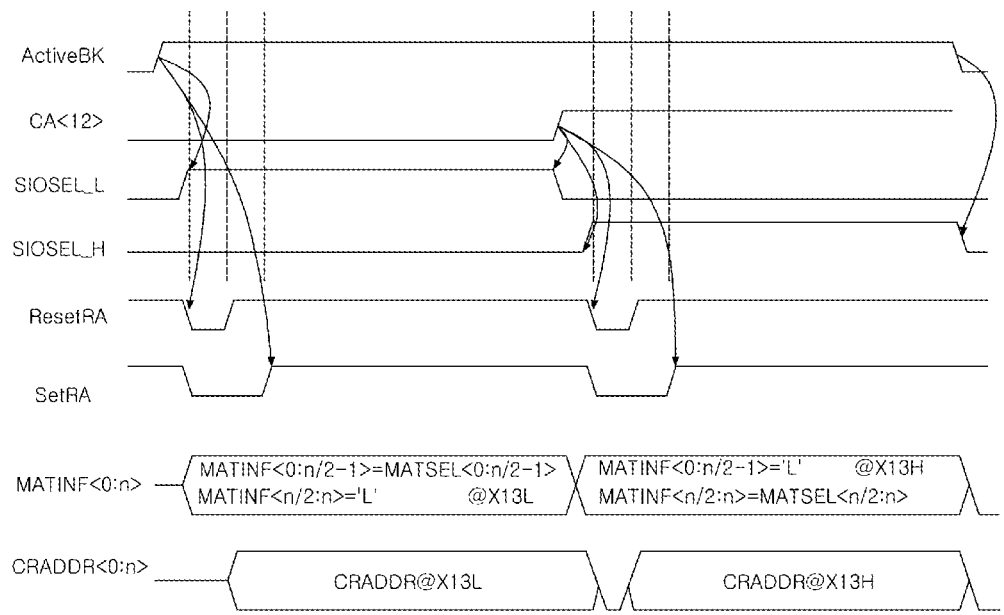
FIG. 9 is a timing diagram illustrating the operation of a repair control circuit according to an embodiment of the present invention.

FIG. 9 is a timing diagram illustrating the operation of a repair control circuit 200 according to an embodiment of the present invention.

Referring to FIG. 9, the repair control operation according to the present invention will be described.

Two word lines are simultaneously activated during an active period of the bank active signal ActiveBK for a test operation.

The selection signal SIOSEL_L is activated using the surplus column address CA<12> of a low level in an active state of the bank active signal ActiveBK (see FIG. 5).

MATSEL<0:n/2-1>, which is one of the plurality of MAT selection signals MATSEL<0:n/2-1> and MATSEL<n/2:n>, is selected using the activated selection signal SIOSEL_L, and is output as the final MAT selection signal MATINF<0:n> (see FIG. 6).

On the other hand, the repair address control signals ResetRA and SetRA are generated during the active period of the selection signal SIOSEL_L (see FIG. 7).

The repair column addresses CRADDR<0:n> are generated depending on whether the fuse, which corresponds to the final MAT selection signal MATINF<0:n> generated by selecting MATSEL<0:n/2-1>, has been cut, and the repair address control signals ResetRA and SetRA (see FIG. 8).

If the repair column addresses CRADDR<0:n> coincide with the column addresses CADDR<0:n>, the repair signal REF is activated, and thus the repair column selection signal RYi<c> is activated to perform the repair operation (see FIG. 4).

Then, the selection signal SIOSEL_H is activated via shifting of the surplus column address CA<12> to a high level (see FIG. 5).

MATSEL<0:n/n>, which is one of the plurality of MAT selection signals MATSEL<0:n/2-1> and MATSEL<n/2:n>, is selected using the activated selection signal SIOSEL_H, and is output as the final MAT selection signal MATINF<0:n> (see FIG. 6).

On the other hand, the repair address control signals ResetRA and SetRA are generated during the active period of the selection signal SIOSEL_H (see FIG. 7).

The repair column addresses CRADDR<0:n> are generated depending on whether the fuse, which corresponds to the final MAT selection signal MATINF<0:n> generated by selecting MATSEL<n/2:n>, has been cut, and the repair address control signals ResetRA and SetRA (see FIG. 8).

If the repair column addresses CRADDR<0:n> coincide with the column addresses CADDR<0:n>, the repair signal REF is activated, and thus the repair column selection signal RYi<c> is activated to perform the repair operation (see FIG. 4).

As described above, according to an embodiment of the present invention, the MAT selection signals are sequentially generated using the surplus column address CA<12>, and thus normal repair column addresses CRADDR<0:n> that correspond to the MAT selection signals, respectively, are generated. Accordingly, it is possible to perform the test in which the plurality of word lines WL<a> and WL<b> are simultaneously activated even after the repair of cells in which defects have occurred is performed.

While certain embodiments have been described above, it will be understood to those skilled in the art that the embodiments described are by way of example only. Accordingly, the is semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A repair control circuit comprising:
    a selection signal generation unit configured to generate selection signals in response to surplus addresses;
    a selection unit configured to selectively output a plurality of memory block selection signals for selecting one or more of a plurality of memory blocks connected to word lines in response to the selection signals; and
    a repair address generation unit configured to generate repair addresses in response to the selection signals and outputs of the selection unit.

2. The repair control circuit of claim 1, wherein the selection signal generation unit is configured to generate the selection signals with different levels depending on levels of the surplus addresses.

3. The repair control circuit of claim 1, wherein the selection signal generation unit is configured to generate the selection signals in response to an active signal and the surplus addresses.

4. The repair control circuit of claim 1, wherein the selection signal generation unit is configured to vary values of the selection signals in response to the surplus addresses for an active period of an active signal.

5. The repair control circuit of claim 1, further comprising a comparison unit configured to compare the repair addresses with external addresses and to generate a repair signal.

6. The repair control circuit of claim 1, wherein column addresses are used as the surplus addresses.

7. The repair control circuit of claim 1, further comprising a repair unit configured to activate a repair column selection signal if a repair signal is activated.

8. A semiconductor integrated circuit comprising:
    a plurality of memory blocks in which a plurality of word lines are arranged;
    a plurality of word line drivers driving one or more of the plurality of word lines in response to a plurality of memory block selection signals; and
    a repair control circuit determining whether to perform a repair via comparison of repair addresses generated in response to surplus addresses and the plurality of memory block selection signals with external addresses.

9. The semiconductor integrated circuit of claim 8, wherein the surplus addresses have different logic levels for different periods in an active period of a bank active signal.

10. The semiconductor integrated circuit of claim 8, wherein the plurality of memory blocks are divided into a first group and a second group, and the plurality of memory block selection signals are independently allocated to the first group and the second group.

11. The semiconductor integrated circuit of claim 8, wherein the repair control circuit is configured to determine whether to perform the repair with respect to a part of the plurality of memory blocks for a time when the surplus addresses have a first logic level, and to determine whether to perform the repair with respect to the remainder of the part of the plurality of memory blocks for a time when the surplus addresses have a second logic level.

12. The semiconductor integrated circuit of claim 8, wherein the repair control circuit comprises:
    a selection signal generation unit configured to generate selection signals in response to the surplus addresses;
    a selection unit configured to selectively output the plurality of memory block selection signals in response to the selection signals; and
    a repair address generation unit configured to generate the repair addresses in response to the selection signals and outputs of the selection unit.

13. The semiconductor integrated circuit of claim 12, wherein the selection signal generation unit is configured to generate the selection signals with different levels depending on logic levels of the surplus addresses.

14. The semiconductor integrated circuit of claim 12, wherein the selection signal generation unit is configured to generate the selection signals in response to a bank active signal and the surplus addresses.

15. The semiconductor integrated circuit of claim 12, wherein the selection signal generation unit is configured to vary values of the selection signals in response to the surplus addresses for an active period of a bank active signal.

16. The semiconductor integrated circuit of claim 12, wherein specified bits of column addresses are used as the surplus addresses.

17. The semiconductor integrated circuit of claim 12, further comprising a comparison unit configured to compare the repair addresses with external addresses and to generate a repair signal.

18. The semiconductor integrated circuit of claim 12, wherein column addresses are used as the surplus addresses.

19. The semiconductor integrated circuit of claim 12, further comprising a repair unit configured to activate a repair column selection signal if a repair signal is activated.

* * * * *